US00RE44879E

(19) United States
(12) Reissued Patent
Mayer et al.

(10) Patent Number: US RE44,879 E
(45) Date of Reissued Patent: May 6, 2014

(54) PHASE LOCKED LOOP, TRANSCEIVER DEVICE AND METHOD FOR GENERATING AN OSCILLATOR SIGNAL

(75) Inventors: Thomas Mayer, Linz (AT); Christian Wicpalek, Linz (AT); Thomas Bauernfeind, Arbing (AT); Linus Maurer, Linz (AT)

(73) Assignee: Intel Mobile Communications GmbH, Neubiberg (DE)

(21) Appl. No.: 13/440,521

(22) Filed: Apr. 5, 2012

Related U.S. Patent Documents

Reissue of:
(64) Patent No.: 7,692,498
Issued: Apr. 6, 2010
Appl. No.: 11/925,379
Filed: Oct. 26, 2007

(30) Foreign Application Priority Data

Oct. 27, 2006 (DE) ..... 10 2006 050 879

(51) Int. Cl.
*H03L 7/00* (2006.01)

(52) U.S. Cl.
USPC ..... 331/17; 331/2; 331/11; 331/23; 331/25

(58) Field of Classification Search
USPC ..... 331/2, 11, 17, 23, 25
See application file for complete search history.

(56) References Cited

U.S. PATENT DOCUMENTS 4,220,914 A * 9/1980 Hekimian ..... 324/621
5,789,987 A * 8/1998 Mittel et al. ..... 331/17
6,208,211 B1 * 3/2001 Zipper et al. ..... 331/17
2005/0047532 A1 * 3/2005 Servilio et al. ..... 375/345
2005/0280564 A1 * 12/2005 Lee ..... 341/61
2007/0096833 A1 5/2007 Maurer et al.

FOREIGN PATENT DOCUMENTS

DE 101 31 224 C1 12/2002
JP 10154932 A 6/1998

OTHER PUBLICATIONS

Eugene B. Hogenauer, "An Economical Class of Digital Filters for Decimation and Interpolation", IEEE Transactions on Acoustics, Speech, and Signal Processing, vol. ASSP-29, No. 2, Apr. 1961, p. 155-162.

"A Fast-Frequency-Switching PLL Synthesizer LSI with a Numerical Phase Comparator", ISSCC95, Session 15, Frequency Synthesizers, Paper FA 15.2, 1995 IEEE International Solid State Circuits Conference, p. 260-262.

* cited by examiner

*Primary Examiner* — Joseph Chang
*Assistant Examiner* — Jeffrey Shin
(74) *Attorney, Agent, or Firm* — Eschweiler & Associates, LLC

(57) ABSTRACT

A phase locked loop has a controlled oscillator for outputting an oscillator signal depending on a control signal. A comparator generates a comparison result from a comparison between a reference frequency signal and a feedback signal derived from the oscillator signal. The phase locked loop also has a filter block for filtering the comparison result and for deriving the control signal from the comparison result, where the filter block has a loop filter and a rejection filter for the frequency-selective attenuation of at least one first interference frequency in the comparison result.

13 Claims, 3 Drawing Sheets

PHASE LOCKED LOOP, TRANSCEIVER DEVICE AND METHOD FOR GENERATING AN OSCILLATOR SIGNAL

Matter enclosed in heavy brackets [ ] appears in the original patent but forms no part of this reissue specification; matter printed in italics indicates the additions made by reissue.

REFERENCE TO RELATED APPLICATIONS

This application claims the benefit of the priority date of German application DE 10 2006 050 879.3, filed on Oct. 27, 2006, the contents of which are herein incorporated by reference in their entirety.

FIELD OF THE INVENTION

The invention relates to a phase locked loop, to a transceiver device and to a method for generating an oscillator signal.

BACKGROUND OF THE INVENTION

Mobile radio systems today use various mobile radio standards such as the Global System for Mobile communication, GSM, Enhanced Data Rates for GSM Evolution, EDGE, Universal Mobile Telecommunications Standard, UMTS, or others. In this case, radio-frequency signals are used for transmission. Other systems also use radio-frequency signals for transmission.

To generate and receive the radio-frequency transmission/reception signals, use is increasingly being made of digitally controlled oscillators, DCOs. As its output signal, a DCO generates a frequency signal on the basis of a digital frequency word. In addition, a digital phase locked loop with a DCO on a semiconductor body requires less space than a corresponding phase locked loop with an analog-controlled voltage controlled oscillator, VCO.

An output signal from the DCO is supplied as an oscillator signal to a phase detector, to a frequency detector or to a phase/frequency detector in order to derive a digital error signal, describing a frequency error or phase error in the oscillator signal, in comparison with a reference signal, which represents a reference frequency. The error signal is usually processed using a digital loop filter to form a control signal for actuating the DCO.

When implementing fully digital phase locked loops, a limited resolution for the digital phase/frequency detector may result in periodic patterns in the digital error signal. Although the error signal is filtered in the phase locked loop by the loop filter, which usually has the nature of a low-pass filter, the frequency properties of the periodic patterns mean that they are rejected only inadequately. The effect may therefore arise that a low-frequency pattern also becomes visible in the output signal from the phase locked loop, and hence a prescribed spectral mask is possibly violated. By way of example, integrated phase noise in the phase locked loop may also be raised.

Such periodic patterns may arise particularly often when the frequency of the oscillator signal is close to an integer multiple of the reference frequency. It is sometimes possible to determine the frequencies at which the periodic patterns arise analytically. To reduce the occurrence of the periodic patterns, the reference frequency signal can be provided with jitter, for example. This requires additional analog circuit blocks, however.

BRIEF SUMMARY OF THE INVENTION

In one exemplary embodiment, a phase locked loop comprises a controlled oscillator for outputting an oscillator signal on the basis of a control signal. In addition, a comparator is provided which generates a comparison result from a comparison between a reference frequency signal and a feedback signal derived from the oscillator signal. Furthermore, the phase locked loop comprises a filter block for filtering the comparison result and for deriving the control signal from the comparison result. In this arrangement, the filter block has a loop filter and a rejection filter for rejecting at least one first interference frequency.

By way of example, the rejection filter has a notch filter which rejects at least the first interference frequency in the frequency range. The loop filter may be connected either upstream or downstream of the rejection filter.

If the first and possibly also further interference frequencies are known from the outset, the periodic patterns can each be removed by narrowband filtering by the rejection filter. By way of example, frequency-selective attenuation by the rejection filter or the notch filter is effected such that the influence of the period patterns becomes negligibly small.

In one exemplary embodiment of a method for generating an oscillator signal, the oscillator signal is generated on the basis of a control signal. The oscillator signal is used to derive a feedback signal, which is compared with a reference frequency signal. The comparison result is filtered, with the filtering involving low-pass filtering and rejection of at least one first interference frequency in the comparison result. The control signal is adapted on the basis of the filtered comparison result.

BRIEF DESCRIPTION OF THE DRAWINGS

The invention is explained in more detail below using a plurality of exemplary embodiments with reference to the figures, in which.

DETAILED DESCRIPTION OF THE INVENTION

Figure 1:
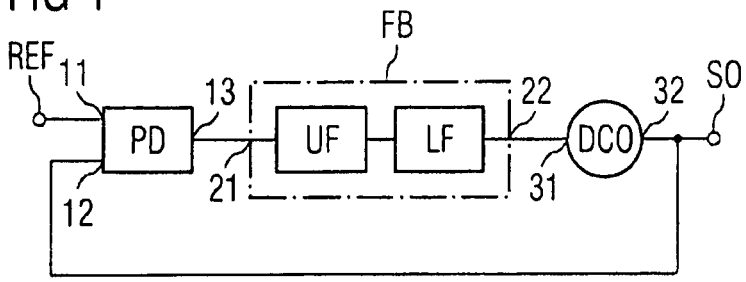
FIG. 1 shows a first exemplary embodiment of a phase locked loop.

The description below summarizes further aspects and embodiments of the present invention. In addition, reference is made to the accompanying figures, which form part of the description and which use illustrations to show how the invention can be implemented in practical terms. The embodiments in the drawings represent a summary to allow better understanding of one or more aspects of the present invention. This summary is not a comprehensive overview of the invention and also is not meant to limit the features or key elements of the invention to one particular embodiment. Rather, the various elements, aspects and features which are disclosed in the exemplary embodiments can be combined in various ways by a specialist person in order to arrive at one or more advantages of the invention.

It would be possible both to use other embodiments and to make structural or logical changes without departing from the basic concept of the present invention. The elements in the drawings are not necessarily true to scale in comparison with one another. Elements which have the same functional action bear the same reference symbols in this context.

FIG. 1 shows an exemplary embodiment of a phase locked loop. The phase locked loop comprises a controlled oscillator DCO, which is in the form of a digitally controlled oscillator, for example. The controlled oscillator DCO has an oscillator input 31 and an oscillator output 32 which is coupled to a signal output SO of the phase locked loop and to an input 12 of a comparator PD. By way of example, the comparator PD is in the form of a phase detector, in the form of a frequency detector or in the form of a phase/frequency detector. The comparator PD has a further input 11, which is coupled to a reference input REF for supplying a reference frequency signal. An output 13 of the comparator PD is coupled to an input 21 of a filter block FB, whose output 22 is connected to the oscillator input 31.

The filter block FB comprises a series circuit containing a rejection filter UF and a loop filter LF. The loop filter LF usually has a low-pass filter response in order to filter out high-frequency components in the comparison result generated by the comparator PD. The rejection filter UF has a filter characteristic which can be used to reject at least one first interference frequency in the comparison result.

If the oscillator frequency, that is to say the frequency of the oscillator signal, is close to a multiple of the reference frequency of the reference frequency signal, periodic patterns may arise in the comparison result. A rate at which an error pattern is repeated in the comparison result can be predicted analytically on the basis of the implementation of the comparator PD. In many cases, the lowest repetition rate for the error pattern is obtained from the difference between the oscillator frequency and the closest integer multiple of the reference frequency. In mobile radio systems today, such as GSM/EDGE and UMTS, a channel spacing for the respective oscillator frequency is provided at a fixed minimum interval of 100 kilohertz or a multiple thereof, for example. Carrier signals for the mobile radio signal are in many cases derived from the oscillator signal through frequency division. By way of example, the controlled oscillator DCO oscillates at an oscillator frequency which corresponds to twice or four times the frequency of the channel frequency of the carrier signal. This may mean that undesirable noise tones generated by the periodic patterns are at frequency intervals from the carrier of 200 kilohertz or 400 kilohertz and a respective multiple thereof, for example.

On the basis of the proposed principle, the rejection filter UF is accordingly set up such that precisely the first interference frequency fe obtained in this manner, that is to say 200 kilohertz, for example, and further interference frequencies 2fe, 3fe, etc. as multiples of the first interference frequency fe, that is to say 400 kilohertz, 600 kilohertz, etc., for example, are each removed by narrowband rejection.

Since the rejection filter UF is within the phase locked loop or within the control loop, a dynamic range for the phase locked loop is affected. By way of example, this also concerns the control loop's phase response, which is important for the stability of the phase locked loop. When designing the phase locked loop or when dimensioning the loop filter LF, the filter characteristic of the rejection filter UF should accordingly be taken into account. The respective narrowband filter action of the rejection filter for the first and the further interference frequencies fe, 2fe, 3fe means that the phase locked loop's phase is usually adversely affected likewise only in a narrow band, so that this can be compensated for by the loop filer, for example, without difficulty.

The use of a rejection filter UF with a narrowband filter characteristic is therefore particularly advantageous in comparison with a broadband filter with comparable rejection of the interference frequencies fe, 2fe, 3fe, which would lead to a non-negligible phase shift and would therefore destabilize the phase locked loop.

Figure 2:
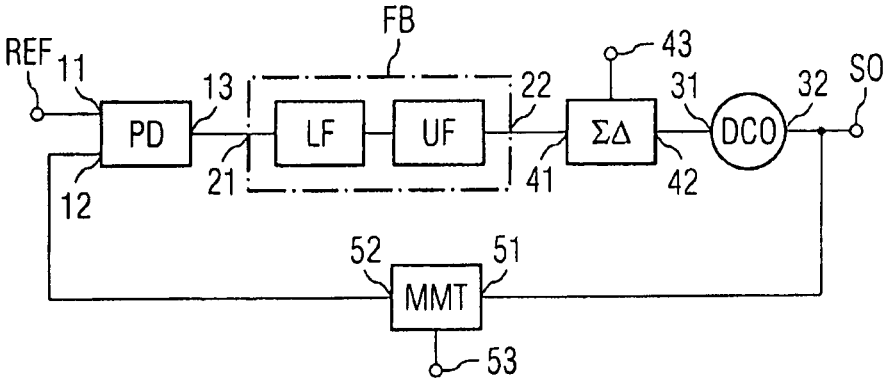
FIG. 2 shows a second exemplary embodiment of a phase locked loop.

FIG. 2 shows another exemplary embodiment of a phase locked loop. In addition to the elements shown in FIG. 1, a sigma-delta modulator ΣΔ having a signal input 41 and a signal output 42 is provided between the filter block FB and the controlled oscillator DCO. In addition, the sigma-delta modulator ΣΔ has a control input 43. Furthermore, the feedback path between the oscillator output 32 and the second input 12 of the comparator PD contains a frequency divider MMT which has a signal input 51, a signal output 52 and a control input 53.

By way of example, the sigma-delta modulator ΣΔ can perform oversampling of the filtered comparison result using sigma-delta modulation. In this context, the control input 43 can be used to supply the sigma-delta modulator ΣΔ with modulation data. By way of example, the frequency divider MMT may be in the form of a multimodulus divider with an adjustable divider ratio which is supplied via the control input 53, for example. A frequency division can be derived from the oscillator signal, for example for the purpose of generating a feedback signal at a frequency adapted to suit the reference frequency signal.

In the filter block FB shown in FIG. 2, the order of the loop filter LF and the rejection filter UF has been swapped in comparison with the exemplary embodiment shown in FIG. 1. Since the loop filter and the rejection filter UF are usually in the form of linear filters, the swap does not generally alter operation of the filter block FB. However, the order of the filters UF, LF can also be taken into account in the filter design when it is assumed that the loop filter LF and/or the rejection filter UF have a nonlinear response.

In the case of the exemplary embodiments of a phase locked loop which are shown in FIG. 1 and FIG. 2, an output signal from the filter block FB or from the sigma-delta modulator ΣΔ is used as a control signal which is taken as a basis for generating the oscillator signal in the controlled oscillator DCO. In FIG. 1, the feedback signal is derived directly from the oscillator signal, while the feedback signal is derived using the frequency divider MMT in FIG. 2. By comparing the feedback signal with the reference frequency signal, the comparator PD generates a comparison signal which, after filtering by the filter block FB, adapts the control signal for the controlled oscillator DCO.

Figure 3:
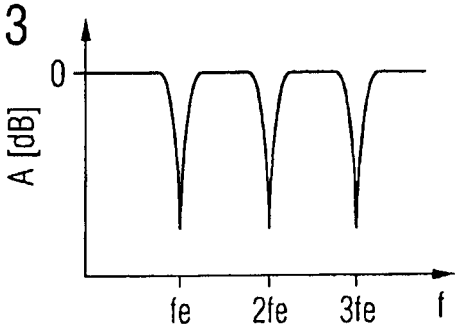
FIG. 3 shows a first exemplary amplitude response for a rejection filter.

FIG. 3 shows an exemplary amplitude response A for a rejection filter UF over frequency f. In mobile radio systems with a fixed channel spacing, such as GSM/EDGE or UMTS, periodic patterns arise in the comparison result at particular frequencies which, although they are dependent on the channel spacing, are independent of a selected channel frequency. By way of example, the period patterns arise at a first interference frequency fe, a second interference frequency 2fe and a third interference frequency 3fe, which are each dependent on the prescribed channel spacing. It is desirable to dimension the rejection filter UF such that it performs frequency-selective attenuation at the interference frequencies fe, 2fe, 3fe in the comparison result containing periodic patterns, as shown by way of example in the amplitude response A in FIG. 3.

For the rejection filter UF or the notch filter, it is possible to use various filter implementations. In this context, the filters used should have the frequency-selective attenuation described. On account of the fixed channel spacing and the fixed interval from interference frequencies arising which is usually generated thereby, it may make sense to use filters in which precisely this interval is obtained for the frequencies which are to be attenuated. One example of such filters are what are known as comb filters, which have respective narrowband attenuation at periodic recurring frequencies.

Figure 4:
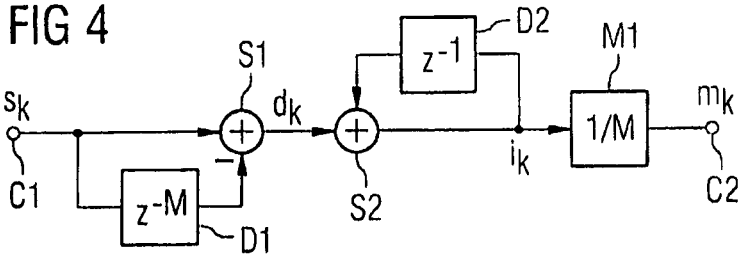
FIG. 4 shows a first exemplary embodiment of a rejection filter.

FIG. 4 shows an exemplary embodiment of a notch filter which is in the form of a cascaded integrator comb filter, or CIC filter for short. The filter comprises a filter input C1, which is supplied with a digital signal $s_k$ to be filtered, and also a filter output C2, at which the filter result $m_k$ can be tapped off. The filter has a differentiator which is formed by a summator S1 and a delay element D1, with a differentiated value $d_k$ being generated by subtracting the current signal value $s_k$ with the signal value delayed by M clock cycles. The differentiated value $d_k$ is supplied to an integrator which is formed by a summator S2 and a feedback delay element D2. The resultant integrated signal value $i_k$ is logically combined with the multiplicative factor 1/M by a multiplier M1 in order to generate the filter result $m_k$.

The multiplicative factor 1/M is supposed to ensure that the filter has unity gain for the frequency 0. The differentiation with subsequent integration in the filter arrangement shown means that the filter result $m_k$ essentially corresponds to the average of the last M input values $s_k$.

The filter shown can be generated without great complexity from a few delay elements, two adders and a multiplier with a constant, the multiplication by a constant also being able to be formed by shift-and-add operations, for example.

Figure 5:
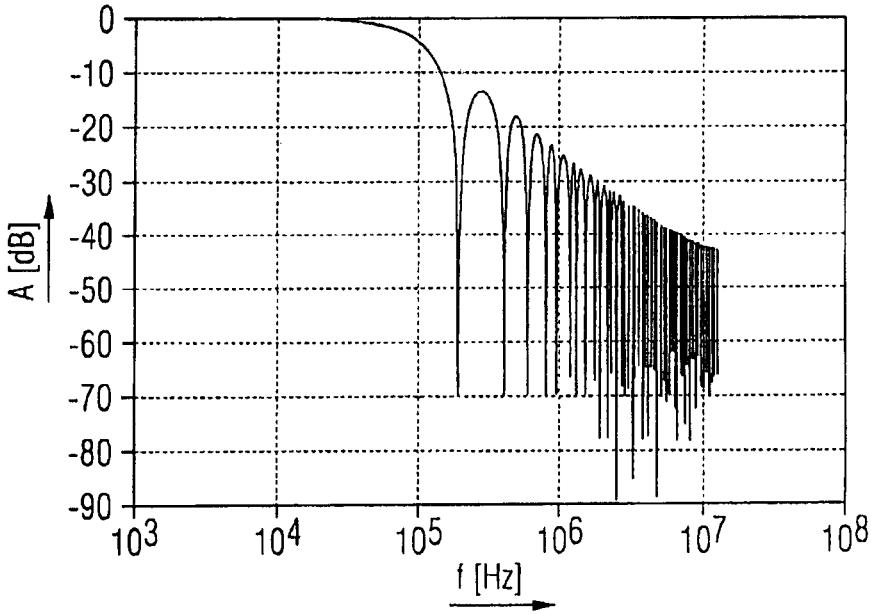
FIG. 5 shows a second exemplary amplitude response for a rejection filter.

FIG. 5 shows an exemplary amplitude response A for a CIC filter generated in this way. In this case, a clock frequency for clocking the delay elements D1, D2 of 26 megahertz and a filter variable M=130 are chosen for this exemplary embodiment. As can be seen, this results in rejection of a first interference frequency of 200 kilohertz and of further interference frequencies at the respective interval of 200 kilohertz. In other words, rejection is obtained for frequencies at an integer multiple of 200 kilohertz.

The factor M may also be chosen differently, with the respective rejection base frequency being calculated from the respective clock frequency at which the filter is operated divided by the factor M. When choosing the base frequency, however, it should be remembered that an excessively low base frequency could reduce the phase shift in the open control loop at the control loop's gain crossover frequency too greatly, in which case it would no longer be possible to compensate for this phase reduction using the loop filter LF. This would result in the phase locked loop becoming unstable. In other words, an excessively low base frequency could result in a usually required phase reserve in the phase locked loop not being able to be assured for the loop bandwidth.

The rejection filter UF or the notch filter can also be generated by one or more at least second-order recursive filters. A filter of this kind, whose infinite impulse response means that it is also called an Infinite Impulse Response filter, IIR filter, can also be used for the frequency-selective attenuation of individual frequencies with appropriate choice of zero points and pole points for its transfer function.

As can be seen from the amplitude response A, at higher frequencies there is a drop in compensation amplitude, that is to say a loss of gain for the comparison signal by the rejection filter. This loss of gain can be compensated for by means of appropriate dimensioning of the upstream or downstream loop filter, however. Accordingly, when designing the phase locked loop the transfer functions of the loop filter LF and of the rejection filter US should be considered together in respect of the entire loop response.

Figure 6:
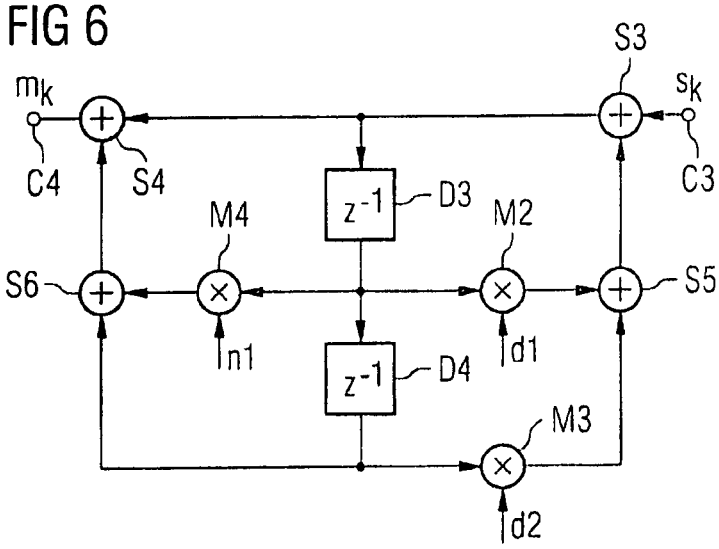
FIG. 6 shows a first exemplary embodiment of a notch filter.

FIG. 6 shows an exemplary embodiment of a second-order recursive filter having a filter input C3 and a filter output C4. The filter comprises a plurality of summators S3, S4, S5, 36 and also multipliers M2, M3, M4 for supplying filter coefficients n1, d1 and d2.

The filter has a forward path which comprises the delay elements D3, D4, the multiplier M4 and the summators S4 and S6. A recursive path in the filter in turn comprises the delay elements D3, D4 and also the multipliers M2, M3 and the summators S3 and S5.

The implementation of the second-order recursive filter which is shown in FIG. 6 is just one of many possible exemplary embodiments of such filters. Other implementations of such filters are widely known.

The filter action of such a filter is dependent on the choice of the appropriate filter coefficients n1, d1, d2. By way of example, the second-order recursive filter shown can be used to remove an interference frequency by narrowband filtering, with the following equation being obtained for the transfer function $H_{NOTCH}(z)$:

$$H_{NOTCH}(z) = K_{NOTCH}\frac{z^{-2} - n1 \cdot z^{-1} + 1}{d2 \cdot z^{-2} - d1 \cdot z^{-1} + 1}. \tag{1}$$

For the gain factor $K_{NOTCH}$, the following applies:

$$K_{NOTCH} = \frac{1}{1 + \tan\left(BW\frac{\pi}{2}\right)}. \tag{2}$$

The value BW is the bandwidth of the band rejection discrepancy generated by the filter relative to the clock frequency $f_s$ at which the filter is operated. In this case, the bandwidth BW usually relates to an amplitude discrepancy of 3 dB relative to the surrounding, unattenuated frequency range. With $f_{NOTCH}$ as the frequency at which the narrowband filtering is to be effected, the following are obtained for the filter coefficients n1, d1, d2:

$$n1 = 2\cos\left(2\pi\frac{f_{NOTCH}}{f_s}\right), \tag{3}$$

$$d1 = 2K_{NOTCH}\cos\left(2\pi\frac{f_{NOTCH}}{f_s}\right), \tag{4}$$

and $$d2 = 2K_{NOTCH} - 1. \tag{5}$$

If more than one interference frequency is supposed to be attenuated by the rejection filter, the filter order of the recursive filter can be extended in line with the desired number of interference frequencies to be rejected. This can be done, by way of example, by extending the structure shown in FIGS. 6 to higher filter orders with further summators, delay elements and multipliers. Another way of increasing the filter order of a recursive filter is to connect a plurality of second-order recursive filters in series, for example. In other words, a higher-order recursive filter can be achieved by cascading a plurality of low-order recursive filters.

Figure 7:
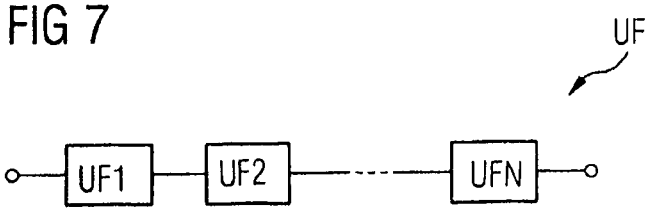
FIG. 7 shows a second exemplary embodiment of a notch filter.

FIG. 7 shows an exemplary embodiment of a rejection filter UF in which a plurality of subfilters UF1, UF2 to UFN are connected in series. Each of the subfilters UF1, UF2 to UFN can be formed by a second-order recursive filter, for example, as shown in FIG. 6. In this case, each of the recursive filters, which respectively perform notch filtering for a particular frequency, may be dimensioned for different interference frequencies.

Hence, by combining a plurality of such recursive notch filters for different interference frequencies, it may become possible to reject exactly those frequency components at which the periodic patterns in the comparison result from the comparator PD would form noise tones in the oscillator signal from the controlled oscillator DCO. In this case, it is also possible to adjust impairment of the phase through a suitable choice of the respective notch width, that is to say the width of the filter notch, using a respective value BW such that there is no risk to stability of the phase locked loop. Since, for higher frequencies, interference components in the comparison result are actually rejected by the low-pass filter nature of the loop filter LF, it may be sufficient to use only a few recursive notch filters to reject relevant periodic patterns. Hence, a surface area involvement and a power requirement for integration in an integrated circuit, for example in a transceiver device in a mobile communication appliance, can remain low.

Figure 8:
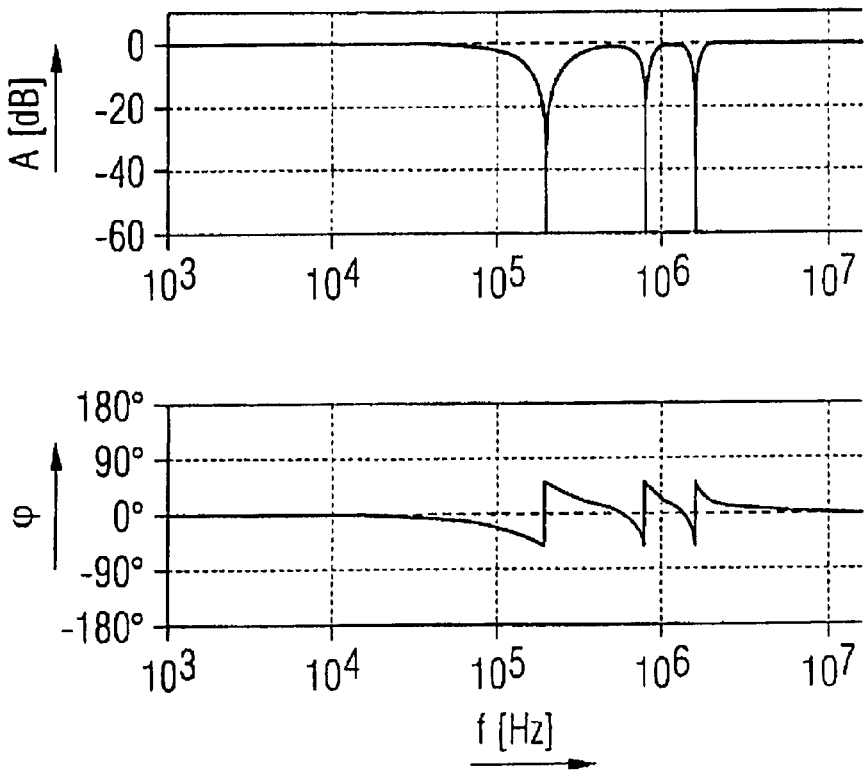
FIG. 8 shows an amplitude and frequency response for a rejection filter.

Since the situation of the frequencies rejected by the recursive notch filters can be set individually, it becomes possible to generate a rejection filter using an irregular notch interval too. FIG. 8 shows an exemplary frequency response for a rejection filter which is generated by three series-connected recursive notch filters. The top half of FIG. 8 shows the amplitude response A for the rejection filter, which performs notch filtering at the frequencies 200 kilohertz, 800 kilohertz and 1600 kilohertz. It is possible to see that the amplitude in the filter's passband is virtually uninfluenced at approximately 0 dB.

The bottom half of FIG. 8 shows the phase responses $\phi$ of the filter. It is possible to see that influencing of the phase is limited essentially to the range around the frequencies which are to be filtered out. Stability of the phase locked loop can therefore be retained without difficulty on account of the phase response.

On the basis of the proposed principle, the positioning of a highly frequency-selective filter within the phase locked loop makes it possible to reject precisely those frequencies at which undesirable patterns arise, without endangering phase stability of the phase locked loop. In this case, the interference frequencies of the interfering patterns should be constant and should be known when the rejection filter is designed.

Normally, both the comparison of the feedback signal or oscillator signal with the reference frequency signal and the filtering using the rejection filter and the loop filter are digital operations in which the signals to be processed are in the form of digital data words.

In systems with a fixed channel spacing, such as GSM/EDGE and UMTS, the interference frequencies appear at constant frequencies in the comparison signal, regardless of the effectively chosen channel frequency or the frequency of the oscillator signal. This means that a rejection filter, once designed, can easily be used for different channel frequencies.

A phase locked loop according to one of the embodiments described can therefore advantageously be used in a frequency generation device for a transmission path or reception path in a mobile communication appliance.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A phase locked loop, comprising:

a digital controlled oscillator configured to generate an oscillator signal, and having an oscillator input and an oscillator output;

a comparator, having a comparator first input coupled to a reference input, a comparator second input coupled to the oscillator output, and a comparator output; wherein the comparator is configured to generate an unwanted periodic pattern as a function of the oscillator signal, where the unwanted periodic pattern includes at least a first interference frequency; and a filter block having a filter block input coupled to the comparator output and having a filter block output coupled to the oscillator input, the filter block comprising a loop filter and a rejection filter, wherein the rejection filter comprises a notch filter comprising an at least second-order recursive filter having one or more filter coefficients for rejecting at least the first interference frequency, wherein the notch filter comprises a plurality of at least second-order recursive filters connected in series which have one or more filter coefficients for rejecting the first interference frequency and further interference frequencies.

2. The phase locked loop of claim 1, wherein the notch filter comprises a cascaded integrator comb filter.

3. The phase locked loop of claim 1, wherein the filter block output is coupled to the oscillator input via a sigma-delta modulator.

4. The phase locked loop of claim 1, wherein the oscillator output is coupled to the comparator second input via a frequency divider.

5. A phase locked loop, comprising:

a digital controlled oscillator configured to output an oscillator signal based on a control signal;

a comparator operable to generate a comparison result from a comparison between a reference frequency signal and a feedback signal derived from the oscillator signal, the comparison result including an unwanted periodic pattern having at least a first interference frequency; and a filter block configured to filter the comparison result and configured to derive the control signal from the comparison result, the filter block comprising a loop filter and a notch filter for the frequency-selective attenuation of at least the first interference frequency in the comparison result, the notch filter comprising an at least second-order recursive filter which has one or more filter coefficients for the frequency-selective attenuation of the first interference frequency, wherein the notch filter further comprises a plurality of at least second-order recursive filters connected in series having one or more filter coefficients for the frequency-selective attenuation of the first interference frequency and further interference frequencies.

6. The phase locked loop of claim 5, wherein the notch filter further comprises a cascaded integrator comb filter.

7. The phase locked loop of claim 5, further comprising a sigma-delta modulator configured to derive the control signal from the filtered comparison result.

8. The phase locked loop of claim 5, further comprising a frequency divider configured to derive the feedback signal from the oscillator signal.

*9. A method for generating an oscillator signal, comprising:*

*generating the oscillator signal depending on a control signal;*

*deriving a feedback signal from the oscillator signal;*

*generating a comparison result by comparing the feedback signal with a reference frequency signal;*

*filtering the comparison result, wherein the filtering involves low-pass filtering and rejection of at least a first interference frequency in the comparison result, and wherein the rejection comprises notch filtering using a plurality of at least second-order recursive filters connected in series that have one or more filter coefficients to reject the first interference frequency; and*

*adapting the control signal depending on the filtered comparison result.*

*10. The method of claim 9, wherein the rejection further comprises comb filtering.*

*11. The method of claim 9, wherein adapting the control signal further comprises performing a sigma-delta modulation of the filtered comparison result.*

*12. The method of claim 9, wherein deriving the feedback signal comprises frequency division of the oscillator signal.*

*13. The method of claim 9, wherein the comparison result is generated as a digital signal, and the filtering is effected digitally.*

* * * * *